United States Patent
Wong Han Boon et al.

[11] Patent Number: 6,030,172
[45] Date of Patent: Feb. 29, 2000

[54] TUBE GUIDE

[75] Inventors: Thomas Wong Han Boon; Ronnie Lee Hock Boon, both of Singapore, Singapore

[73] Assignee: Advanced Micro Devices, Inc., Sunnyvale, Calif.

[21] Appl. No.: 09/298,446

[22] Filed: Apr. 23, 1999

[51] Int. Cl.⁷ .................................................. B65B 35/00
[52] U.S. Cl. ..................................... 414/797.9; 414/797.8
[58] Field of Search .............................. 414/797.9, 797.7, 414/797.8, 417, 403; 221/93, 95; 312/42, 45

[56] References Cited

U.S. PATENT DOCUMENTS

| | | | |
|---|---|---|---|
| 3,602,378 | 8/1971 | Thompson | 414/797.9 |
| 4,500,246 | 2/1985 | Janisiewicz et al. | 414/403 |
| 4,539,740 | 9/1985 | Scrantom et al. | 29/564.1 |
| 4,588,342 | 5/1986 | Hirokawa et al. | 414/125 |
| 4,862,578 | 9/1989 | Holcomb | 414/417 |
| 4,941,795 | 7/1990 | Elliot et al. | 414/403 |
| 5,246,328 | 9/1993 | Schuppert, Jr. et al. | 414/417 |
| 5,370,495 | 12/1994 | Montalvo et al. | 414/797.9 |
| 5,470,196 | 11/1995 | Park | 414/797.9 |
| 5,733,093 | 3/1998 | Palm et al. | 414/417 |

FOREIGN PATENT DOCUMENTS

| | | | |
|---|---|---|---|
| 62-185634 | 9/1987 | Japan | 414/797.9 |
| 2220649 | 1/1990 | United Kingdom | 414/797.9 |

*Primary Examiner*—Douglas Hess
*Attorney, Agent, or Firm*—Davis Chin

[57] ABSTRACT

An improved input tube unloader assembly is provided for use with an IC handler structure so as to eliminate damage to IC packages and/or jamming of tubes. The input tube unloader assembly is comprised of a frame member and a pair of opposed main side plate members being supported on opposite ends of the frame member. Each of the pair of opposed main side plate members includes an upright section, a pair of transverse bracket portions joined to opposed sides of the upright section, and a tube guide portion mounted on an interior surface of the upright section. The tube guide portion is formed of an inverted T-shaped configuration and includes a longer vertical leg and a shorter horizontal leg joined integrally to a lower end of the longer vertical leg in its middle area.

10 Claims, 4 Drawing Sheets

Fig. 1 - Prior Art

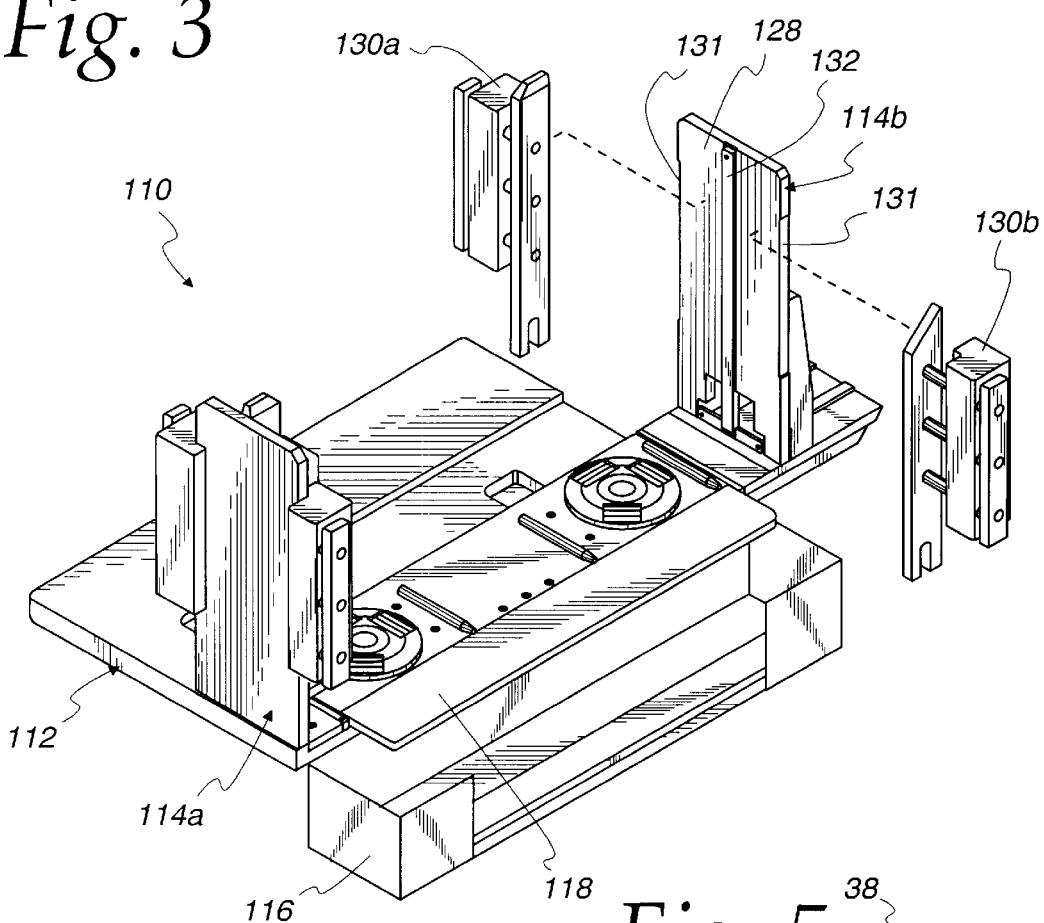
Fig. 3
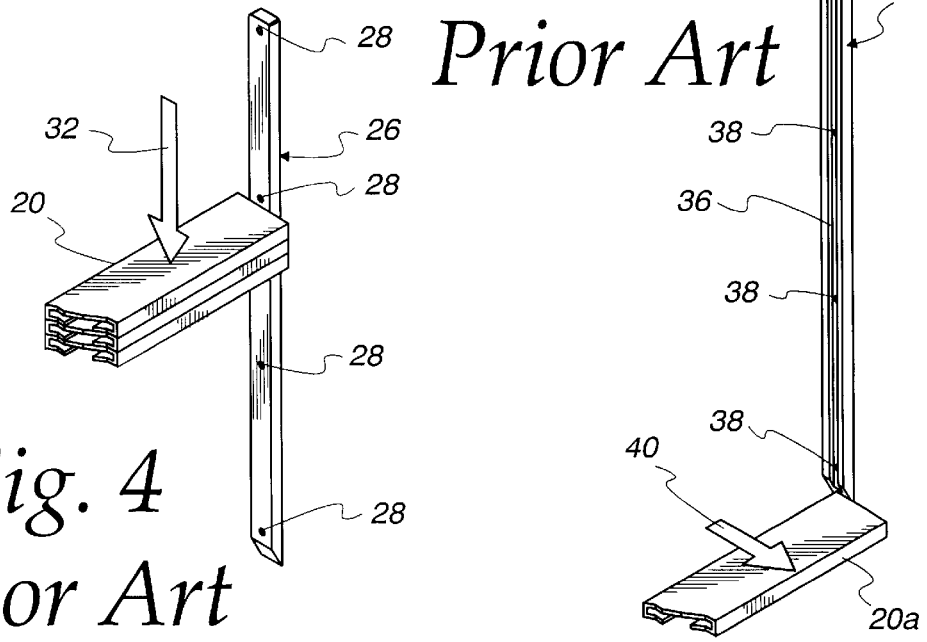
Fig. 4 Prior Art
Fig. 5 Prior Art

TUBE GUIDE

BACKGROUND OF THE INVENTION

This invention relates generally to handler equipment for processing of semiconductor IC packages. More particularly, it relates to a tube guide of a unique construction for use with an input tube unloader assembly of a handler structure for smoothly guiding the movement of stacked tubes so as to eliminate damage to IC packages therein and/or jamming of the tubes.

As is generally known in the semiconductor industry, there has been a trend toward manufacturing of semiconductor IC chips with higher and higher packing densities. As a result, flat pack or dual-in-line package (DIP) structures for housing semiconductor IC chips has been replaced in recent years by extremely small-sized rectangularly-shaped packages of the type referred to as "plastic leaded chip carrier" (PLCC) packages. Typically, these PLCC packages are of a rectangular shape with varying width and length dimensions. This is due to the fact that the package size is dependent upon the number of terminal leads or pins formed on the four sides of the PLCC package. For example, the number of terminal leads on a PLCC package may be 20, 28, 32, 44, 68 or 84. Further, chip carrier tubes are generally used for housing and/or shipping a relatively large number of these PLCC packages from one work station to another work station or from a chip manufacturer's plant to a customer's location.

In view of these developments, there have also been made significant changes in the design and performance of different types of handler equipment for processing automatically of semiconductor IC packages. Such handler equipment or structures may be used to perform various manufacturing processes, like lead-straightening, lead inspection, marking or mark-inspection for the PLCC packages. One conventional type of handler structure used for a lead-inspection procedure is illustrated in FIG. 1 and is labeled "Prior Art." As can be seen, the handler structure 10 is comprised of a tube unloading station 12, a visual inspection station 14, and a tube loading station 16.

As is well-known in the art, the tube unloading station 12 includes an input tube unloader assembly 18 which receives a plurality of stacked tubes 20. Each of the stacked tubes is previously loaded or completely filled with a plurality of PLCC packages or devices 22. The tubes 20 are preferably formed of a unitary construction and are formed of a suitable plastic or metal material. The tubes 20 are then manually loaded or stacked into a vertical position by an operator. The input tube unloader assembly 18 is used to unload or deliver the PLCC packages 22 housed within each of the respective tubes 20 onto a feed-track 24. The unloader assembly 18 releases the PLCC packages 22 in the lowermost tube 20a onto the feed-track 24, which will guide them in the direction of arrow 25 to the next work station or the visual-inspection station 14. After completion of the visual inspection, the PLCC packages 22 are delivered to the output tube loader 16 for subsequent processing operations.

However, the unloader assembly 18 suffers from the disadvantage that it uses a metal (aluminum) tube guide located adjacent to and contactly engaging the opposite ends of the stacked tubes. The metal tube guide serves to facilitate the movement of the stacked tubes 20 in a downward fashion and onto an unloading area. As can best be seen from FIG. 4, the prior art metal tube guide is formed of an elongated narrow post 26. A plurality of mounting holes 28 extend between the opposite ends of the narrow post 26. The mounting holes 28 are used to firmly secure the post 26 to a main side plate 30 (FIG. 1) of the unloader assembly 18.

In use, it was found that as the respective tubes 20 are being slid downwardly in the direction of arrow 32 there is caused a wearing-out of the mounting holes 28 due to the frictional engagement or rubbing of the ends of the tubes against these holes 28. Further, since the stacked tubes 20 on the unloader assembly 18 are being tilted so as to dispense the PLCC packages 22 from the tubes, it was discovered that the endmost one of the PLCC packages 22 in the respective tubes 20 will come into direct physical contact with the mounting holes and will rub against them. As a consequence, as each of the stacked tubes 20 slides downwardly towards the lower end of the tube guide 26 the leads on the endmost ones of the PLCC packages 22 are highly susceptible to possible physical damage or even destruction.

In order to solve these problems, there has been proposed in the prior art of an improved tube guide of FIG. 5, which is formed of an elongated narrow post 34 with a recessed central portion defining a slot 36. A plurality of mounting holes 38 extend between the opposite ends of the narrow post 34. The plurality of mounting holes 38 are also disposed within the slot 36 so as to protect the same against wearing-out by rubbing. Nevertheless, this prior art solution is not without its own problem. Specifically, as the lowermost tube 20a reaches the bottom of the stack adjacent to the lower end of the narrow post 34, there has been encountered a knocking or jamming of the lowermost tube within the slot 36 in the central portion of the narrow post 34 during an indexing operation for delivering or ejecting sideways in direction of arrow 40 the lowermost tube 20a into a container bin after it has been emptied. As a result, there is caused a jamming of the tubes before they are pushed out or ejected sideways into the container bin.

Therefore, there has arisen still a need for an improved tube guide of a novel design for use with an input tube unloader assembly of a handler structure for smoothly guiding the movement of stacked tubes so as to eliminate damage to IC packages therein and/or jamming of the tubes. This is achieved in the present invention by the provision of a unique tube guide portion having a T-shaped configuration. As a result, the overall mechanical process of the unloader assembly has been significantly enhanced. Since the leads of the PLCC packages are being prevented from being damaged by direct contact with the mounting holes of the tube guides, there will be a smaller rejection rate of the PLCC packages due to deformed or bent leads. In addition, the through-put for the handler operation will be substantially increased as jamming of the tubes will have been reduced or eliminated.

SUMMARY OF THE INVENTION

Accordingly, it is a general object of the present invention to provide a tube guide of a unique construction for use with an input tube unloader assembly of a handler structure which is relatively simple and economical to manufacture and assemble, but yet overcomes the disadvantages of the prior art input tube unloader assemblies.

It is an object of the present invention to provide a new and improved tube guide which eliminates damage to IC packages and/or jamming of stacked tubes.

It is another object of the present invention to provide a new and improved tube guide formed of an inverted T-shaped configuration and includes a longer vertical leg and a shorter horizontal leg joined integrally to a lower end of the longer vertical leg in its middle area.

It is still another object of the present invention to provide a new and novel tube guide which reduces the rejection rate of PLCC packages due to deformed or bent leads and has an increased through-put.

In a preferred embodiment of the present invention, there is provided an input tube unloader assembly for use with an IC handler structure so as to eliminate damage to IC packages and/or jamming of tubes. The tube guide input tube unloader assembly includes a frame member and a pair of opposed main side plate members. The pair of opposed main side plate members are supported on opposed ends of the frame member.

Each of the pair of opposed main side plate members includes an upright section, a pair of transverse bracket portions joined to opposed sides of the upper section, and a tube guide portion mounted on an interior surface of the upright section. The tube guide portion is formed of an inverted T-shaped configuration. The tube guide portion includes a longer vertical leg and a shorter horizontal leg joined integrally to a lower end of the longer vertical leg in its middle area.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 is an exploded view of the unloader assembly of FIG. 2;

FIG. 4 is a perspective view of a prior art tube guide, illustrating the problem of wear-out;

FIG. 5 is a perspective view of another prior art tube guide, illustrating the problem of knocking or jamming;

DESCRIPTION OF THE PREFERRED EMBODIMENT

Figure 1:
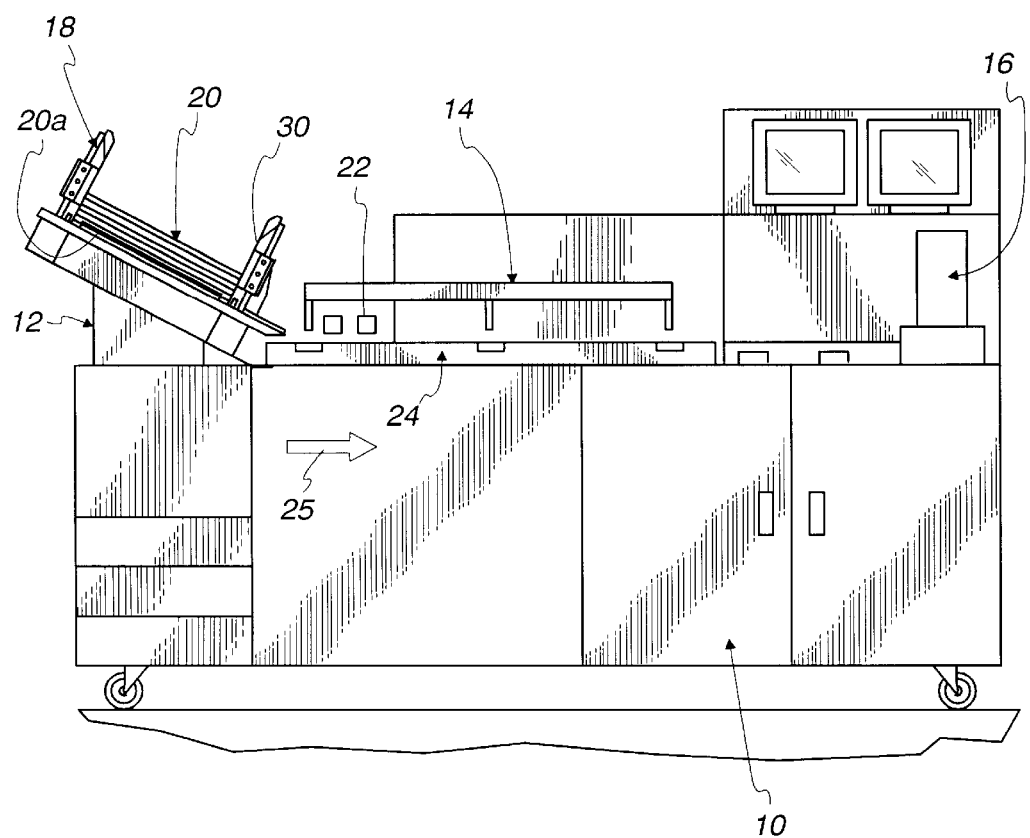
FIG. 1 is a front elevational view of a conventional handler structure used for lead-inspection of PLCC packages.
Figure 2:
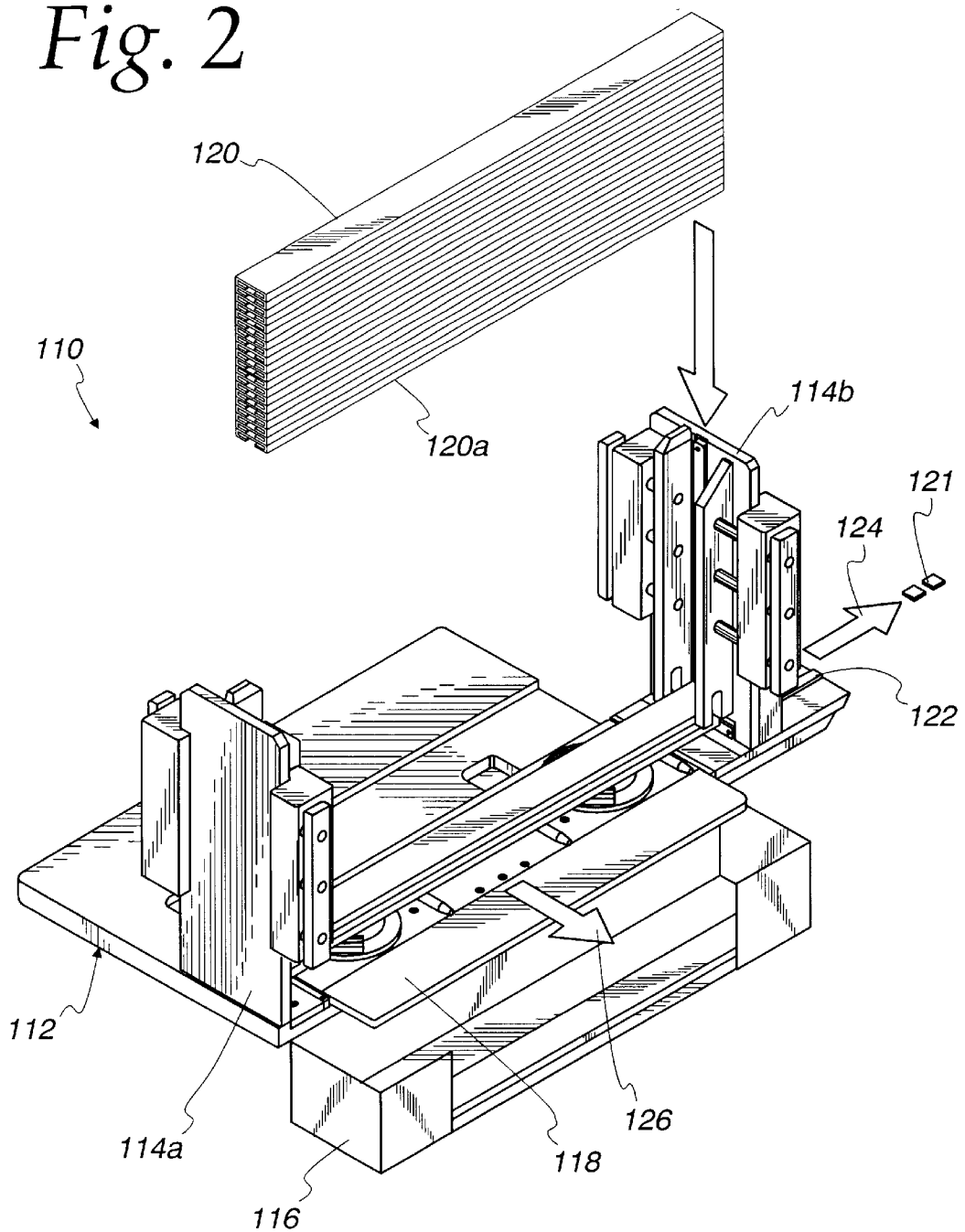
FIG. 2 is a perspective view of an input tube unloader assembly of the present invention for use in the handler structure of FIG. 1.

Referring now in detail to the various views of the drawings, there is shown in FIGS. 2 and 3 an improved input tube unloader assembly of the present invention generally designated by reference numeral 110 which is especially designed to be integrated with the handler structure 10 of FIG. 1 for performing a lead-inspection process on PLCC packages. The input tube unloader assembly 110 is comprised of a substantially rectangularly-shaped frame member 112, a pair of opposed main side plate member 114a and 114b supported on opposite ends of the side member 112, a bin container 116, and a horizontally moveable plate 118 for ejecting empty tubes into the bin container.

As the plurality of metal or plastic tubes 120 filled with PLCC packages 121 are loaded vertically or stacked between the opposed main side plates 114a, 114b by an operator, each of the plurality of tubes 120 will be slid downwardly from the top end to the bottom end of the side plate members 114a, 114b. The PLCC packages in the lowermost tube 120a, as it reaches a position adjacent to the bottom end of the plate member, will be unloaded or emptied onto a feed-track 122 which will guide them in the direction of arrow 124 to the next work station. After the lowermost tube 120a is completely unloaded, the horizontally moveable plate 118 will cause the stacked tubes 120 to be indexed so as to make ready the next lowermost tube for unloading as well as ejecting sideways in the direction of arrow 126 the lowermost tube 120a, that has just been emptied, into the bin container 116.

As can be best seen from FIG. 3, there is shown an exploded perspective view of the main side plate member 114b. Since the side plate members 114a and 114b are identical in their construction, it will be sufficient to describe in detail only one of them. The plate member 114b includes a rectangularly-shaped flat upright section 128, a pair of transverse bracket portions 130a, 130b joined to opposite sides 131 of the upright section 128, and a novel tube guide portion 132 of the present invention. The tube guide portion 132 is mounted on the interior surface of the upright section 128 in an intermediate area between the sides thereof.

Figure 6:
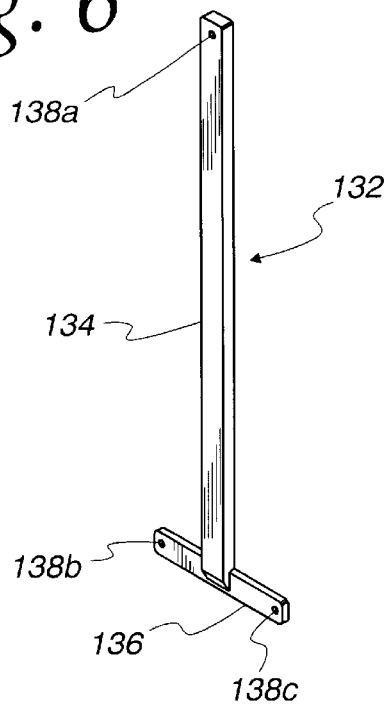
FIG. 6 is a perspective view of a tube guide portion, constructed in accordance with the principles of the present invention.
Figure 7:
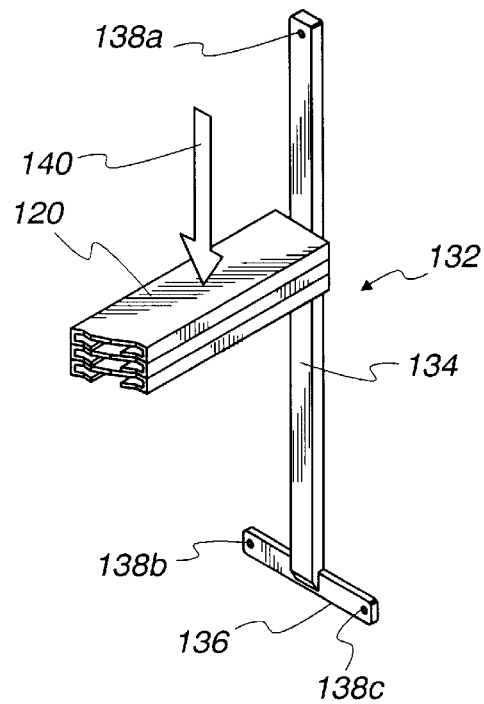
FIG. 7 is a perspective view of the tube guide portion of FIG. 6, useful in understanding how the wearing-out problem is solved.
Figure 8:
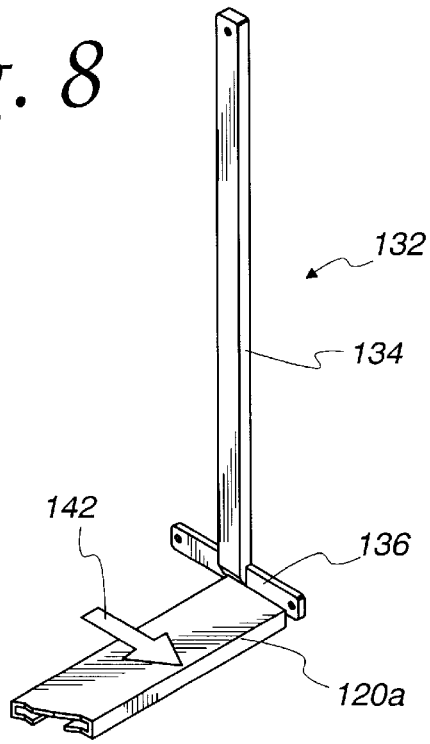
FIG. 8 is a perspective view of the tube guide portion of FIG. 6, useful in understanding how the knocking or jamming problem is solved.

With reference now to FIGS. 6–8, it can be seen that the tube guide portion 132 of the present invention is of a unique configuration which is formed of a single-piece construction and is made of a metallic material, such as chrome-plated stainless steel and the like. The tube guide portion 132 is formed of an inverted T-shaped configuration and includes a longer vertical leg 134 and a shorter horizontal leg 136 joined integrally to the lower end of the vertical leg in its middle area. A first mounting hole 138a is formed adjacent to the upper end of the vertical leg 134. Second and third mounting holes 138b, 138c are formed adjacent to the respective opposite ends of the shorter leg 136. The first through third mounting holes 138a–138c are adapted to receive screws (not shown) or the like for fixedly securing the tube guide portion 132 to the upright section 128 of the main side plate member 114b.

In FIG. 7, there is illustrated a perspective view of a portion of the stacked tubes 120 shown in association with the tube guide portion 132 of the present invention. In order to overcome or eliminate the problem of wearing-out of the mounting holes, the tube guide portion 132, unlike the prior art tube guide 26 of FIG. 4 or tube guide 36 of FIG. 5, has only the three mounting holes 138a–138c which are located at the distal or extreme outer ends of the vertical and horizontal legs 134, 136. As a result, when the stacked tubes 120 are being slid downwardly in direction of arrow 140 there will be no contact engagement made with the mounting holes at all since they have been positioned to be out of the path of the tubes. Thus, the mounting holes 138a–138c of the tube guide portion 132 will never be worn out. Further, the leads of the endmost ones of the PLCC packages 121 will not be damaged by rubbing against such mounting holes. Thus, the rejection rate of the PLCC packages due to bent or scratched leads will be substantially decreased.

In FIG. 8, there is illustrated a perspective view of the lowermost tube 120a shown in association with the tube guide portion 132 of the present invention. In order to overcome or eliminate the problem of jamming or knocking of the tubes, it will be noted that the vertical leg 134 of the tube guide portion 132, unlike the prior art tube guide 36 of FIG. 5, does not have a slot formed in its middle area. As a consequence, the stacked tubes are allowed to flow smoothly downward from the upper end to the lower end of the vertical leg 134 until the lowermost tube 120a is indexed sideways along the shorter leg 136 in the direction of arrow 142 and into the bin container. Therefore, the through-put for the overall unloading operation has been also increased since the jamming or knocking of the lowermost tube 120a with the tube guide portion has been reduced or eliminated.

From the foregoing detailed description, it can thus be seen that the present invention provides an input tube unloader assembly for use with an IC handler structure so as to eliminate damage to IC packages therein and/or jamming of tubes. This is achieved by the provision of an improved input tube unloader assembly which includes a novel tube guide portion. The tube guide portion of the present invention is formed of an inverted T-shape configuration and includes a longer vertical leg and a shorter horizontal leg joined integrally along a lower end of the longer vertical leg in its middle area.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An input tube unloader assembly for use with an IC handler structure so as to eliminate damage to IC packages and/or jamming of tubes, said input tube unloader assembly comprising:

a frame member;

a pair of opposed main side plate members being supported on opposite ends of said frame member;

each of said pair of opposed main side plate members including an upright section, a pair of transverse bracket portions joined to opposed sides of said upright section, and a tube guide portion mounted on an interior surface of said upright section; and said tube guide portion being formed of an inverted T-shaped configuration and including a longer vertical leg and a shorter horizontal leg joined integrally to a lower end of said longer vertical leg in its middle area.

2. An input tube unloader assembly as claimed in claim 1, wherein said tube guide portion is formed of a single-piece construction.

3. An input tube unloader assembly as claimed in claim 1, wherein said tube guide portion is formed of a metallic material.

4. An input tube unloader assembly as claimed in claim 3, wherein said metallic material is chrome-plated stainless steel.

5. An input tube unloader assembly as claimed in claim 1, wherein said tube guide portion includes only three mounting holes, said mounting holes being located at extreme ends of said longer vertical leg and said shorter horizontal leg.

6. An input tube unloader assembly for use with an IC handler structure so as to eliminate damage to IC packages and/or jamming of tubes, said input tube unloader assembly comprising:

frame means;

opposed main side plate means being supported on opposite ends of said frame means;

said opposed main side plate means including an upright section, a pair of transverse bracket portions joined to opposed sides of said upright section, and a tube guide portion mounted on an interior surface of said upright section; and said tube guide portion being formed of an inverted T-shaped configuration and including a longer vertical leg and a shorter horizontal leg joined integrally to a lower end of said longer vertical leg in its middle area.

7. An input tube unloader assembly as claimed in claim 6, wherein said tube guide portion is formed of a single-piece construction.

8. An input tube unloader assembly as claimed in claim 6, wherein said tube guide portion is formed of a metallic material.

9. An input tube unloader assembly as claimed in claim 8, wherein said metallic material is chrome-plated stainless steel.

10. An input tube unloader assembly as claimed in claim 6, wherein said tube guide portion includes only three mounting holes, said mounting holes being located at extreme ends of said longer vertical leg and said shorter horizontal leg.

* * * * *